United States Patent [19]

Bohnert et al.

[11] Patent Number: 5,679,631
[45] Date of Patent: *Oct. 21, 1997

[54] LIMONENE AND TETRAHYDROFURFURYL ALCOHOL CLEANING AGENT

[75] Inventors: George W. Bohnert, Harrisonville; Richard D. Carter; Thomas E. Hand, both of Lee's Summit, all of Mo.; Michael T. Powers, Santa Rosa, Calif.

[73] Assignee: AlliedSignal, Inc., Morristown, N.J.

[*] Notice: The term of this patent shall not extend beyond the expiration date of Pat. No. 5,514,294.

[21] Appl. No.: 577,723

[22] Filed: Dec. 22, 1995

Related U.S. Application Data

[63] Continuation-in-part of Ser. No. 343,651, Nov. 22, 1994, Pat. No. 5,514,294.

[51] Int. Cl.$^6$ .............. C11D 7/26; C11D 7/50; C11D 7/60
[52] U.S. Cl. ............ 510/411; 510/175; 510/177; 510/365; 510/407; 510/408; 510/415; 510/245; 510/254; 252/364; 134/40
[58] Field of Search .................. 510/175, 177, 510/365, 408, 411, 415, 407, 413, 245, 254; 134/40; 252/364, 170, DIG. 8, DIG. 9

[56] References Cited

U.S. PATENT DOCUMENTS

| | | | |
|---|---|---|---|
| 3,870,536 | 3/1975 | Blanco | 106/146 |
| 3,907,900 | 9/1975 | Evers et al. | 568/55 |
| 4,274,884 | 6/1981 | Cartwright | 134/4 |
| 4,414,128 | 11/1983 | Goffinet | 252/111 |
| 4,511,488 | 4/1985 | Matta | 252/162 |
| 4,561,991 | 12/1985 | Herbots | 252/118 |
| 4,600,522 | 7/1986 | Grzeskowiak, Jr. | 252/170 |
| 4,620,937 | 11/1986 | Dellutri | 252/143 |
| 4,640,719 | 2/1987 | Hayes | 134/40 |
| 4,664,721 | 5/1987 | Valasek | 134/26 |
| 4,686,065 | 8/1987 | Bliznik | 252/159 |
| 4,740,247 | 4/1988 | Hayes | 134/42 |
| 4,758,377 | 7/1988 | Iding | 252/556 |
| 4,767,563 | 8/1988 | de Buzzaccarini | 252/174.25 |
| 5,064,557 | 11/1991 | Fusiak | 252/162 |
| 5,112,516 | 5/1992 | Koetzle | 252/162 |
| 5,120,371 | 6/1992 | Bolden | 134/40 |
| 5,128,057 | 7/1992 | Bixenman | 252/162 |
| 5,213,624 | 5/1993 | Williams | 134/40 |
| 5,277,836 | 1/1994 | Peters | 252/143 |
| 5,300,154 | 4/1994 | Ferber | 134/26 |
| 5,334,331 | 8/1994 | Fusiak | 134/40 X |
| 5,340,407 | 8/1994 | Bolden | 134/38 |
| 5,427,710 | 6/1995 | Stevens | 252/166 |
| 5,456,853 | 10/1995 | Myers, II | 252/170 |
| 5,514,294 | 5/1996 | Bohnert et al. | 134/40 X |

FOREIGN PATENT DOCUMENTS

0106266  4/1984  European Pat. Off. .

OTHER PUBLICATIONS

Grant's & Hackh's Chemical Dictionary, Fifth Edition, 1987, p. 452.

Mellan, I., Industrial Solvents Handbook, Second Edition, Noyes Data Corp., NJ 1977 pp. 227–229.

Azeotropic Data, No. 6 in the Advances on Chemistry Series, American Chemical Society, Washington, D.C. Jun. 1952 p. 144.

Primary Examiner—Douglas J. McGinty
Attorney, Agent, or Firm—Shook, Hardy & Bacon

[57] ABSTRACT

The present invention is a tetrahydrofurfuryl alcohol and limonene cleaning agent and method for formulating and/or using the cleaning agent. This cleaning agent effectively removes both polar and nonpolar contaminants from various electrical and mechanical parts and is readily used without surfactants, thereby reducing the need for additional cleaning operations. The cleaning agent is warm water rinsable without the use of surfactants. The cleaning agent can be azeotropic, enhancing ease of use in cleaning operations and ease of recycling.

17 Claims, No Drawings

5,679,631

LIMONENE AND TETRAHYDROFURFURLY ALCOHOL CLEANING AGENT

This application is a continuation in part of application Ser. No. 08/343,651 filed Nov. 22, 1994, now U.S. Pat. No. 5,514,294. Related application Ser. No. 08/535,897, filed Sep. 28, 1995, also currently pending, is a divisional application of Ser. No. 08/343,651.

The U.S. Government has rights in this invention pursuant to contract number DE-AC04-76-DP00613 with the United States Department of Energy.

BACKGROUND OF THE INVENTION

Environmental considerations are driving increased use of environmentally-friendly chemicals in manufacturing. Environmental considerations include whether the chemicals are toxic, whether they have ozone-depleting properties, whether the chemicals are available from renewable resources, and whether they are biodegradable or recyclable. Chemical cleaning agents, used in a variety of situations including the manufacture of electrical and mechanical components to remove grease, solder flux, cutting oil and other contaminants from the manufacturing processes, are being examined in light of these environmental considerations. These environmental considerations, coupled with advances in solvent chemistries, have resulted in increased use of low-volatility cleaning agents for use with water rinses, commonly referred to as semiaqueous cleaners.

A primary advantage in the use of low-volatility cleaning agents is the reduction in amount of chemicals vaporized as part of the cleaning processes. However, because these cleaning agents do not evaporate rapidly, rinses are typically required to remove the cleaning agent from the substrate being cleaned.

Some of the semiaqueous cleaners in use involve limonene as a cleaning agent, followed by a water rinse to remove the cleaning agent. (Reference herein to limonene includes the isomers d- and l-limonene and any combination of these isomers.) Because limonene is not miscible in water, these cleaners require the addition of a surfactant to facilitate water rinsing. Limonene is specified in various U.S. patents to be used as a cleaning agent, typically to be blended with surfactants and water.

There are deficiencies in use of limonene as a cleaning agent, however. The surfactants used to allow water rinsing generally are nonvolatile materials, some of which remain on the substrate being cleaned in areas which tend to trap contaminants, such as in joints, in stranded wires, and in nonhermetically sealed assemblies. Further, these limonene and surfactant cleaning agents generally are not readily distilled because of the nonvolatile nature of the surfactants, complicating recycling of the cleaning agent for reuse. Finally, limonene is not fully effective in removing polar contaminants.

Additionally, alcohols are advantageous for cleaning because, typically, they effectively remove polar contaminants. Traditional short-chain linear alcohols such as isopropyl are flammable and, thus, are difficult to use in automatic cleaning equipment because of the fire and explosion hazards associated with flammable vapors around electrical equipment. The National Electrical Code imposes strict requirements upon equipment manufactured to use flammable liquids. Typically, this involves various combinations of purging with an inert gas, using explosion-proof electrical enclosures, or intrinsically safe wiring practices. All of these design considerations substantially increase the complexity and cost of utilizing alcohols with low flash points as cleaning agents. Further, alcohols which have traditionally been used as cleaning agents have relatively high vapor pressure, causing the release of relatively large amounts of vapors from cleaning operations.

Long-chain linear alcohols (seven or more carbon atoms) have higher flash points and lower vapor pressures than short-chain alcohols, resolving some of the limitations for using linear alcohols as cleaning agents. However, the long-chain linear alcohols are generally not miscible in water, and, therefore, require surfactants to allow mixing and rinsing with water. For example, U.S. Pat. No. 5,300,154 discusses, among other things, utilizing long-chain linear alcohols in combination with various terpenes, including limonene. These combinations do not appear to be water rinsable without the use of surfactants.

A recent advance in cleaning technologies has been the use of heterocyclic alcohols, including tetrahydrofurfuryl alcohol. Tetrahydrofurfuryl alcohol is used in biocide and pesticide formulations, paint stripping formulations, fabric dyes, and as a cleaning agent. Utilized as a cleaning agent, tetrahydrofurfuryl alcohol typically is blended with surfactants and water in a cleaning solution formulated to remove polar contaminants such as solder flux. Although this alcohol is completely miscible in water, the surface tension of tetrahydrofurfuryl alcohol is relatively high (37 dynes/cm) prompting the use of surfactants to lower the surface tension of the resulting solution and allow it to more readily wet the substrate being cleaned. Items cleaned with tetrahydrofurfuryl alcohol can be water rinsed and are generally considered organically and inorganically (ionically) clean, although the presence of surfactants presents contaminant problems similar to those discussed previously.

Ease of recycling of cleaning agents is important to reduce waste and because it often is more cost-effective to recycle cleaning agents rather than to continually replace used cleaning agents with new. In this regard, azeotropic or azeotrope-like compositions are desirable because they do not fractionate upon boiling. This behavior is desirable because azeotropic or azeotrope-like cleaning agents may be distilled for recycling. In comparison, preferential boiling of the components with lower-boiling points of non-azeotrope-like cleaning agents tends to result in distillate mixtures which have component fractions unlike the original cleaning agents. The changed composition may have less desirable or entirely different properties than the original. Therefore, azeotropic and azeotrope-like compositions enhance recycling.

Thus, there is a need for environmentally-friendly, easily recyclable, preferably azeotropic or azeotrope-like, low vapor pressure, high flash point cleaning agents which effectively remove both polar and non-polar contaminants without use of surfactants. The present invention addresses this need.

DESCRIPTION OF THE INVENTION

The present invention to address the need described above is a composition which may be used as a cleaning agent, and methods for formulating and using that composition, the composition being comprised of the components tetrahydrofurfuryl alcohol and limonene in amounts effective to accomplish desired cleaning operations.

The present invention effectively removes both nonpolar contaminants such as rosin fluxes, greases, oils, waxes, and tape residues as well as polar contaminants such as plating salts and flux activators. Indeed, as disclosed further in the examples below, the cleaning efficacy of the present invention unexpectedly far surpasses the individual cleaning capabilities of either component individually. In addition, the present invention has a moderately high flash point and low vapor pressure enhancing its ease and safety of use and environmental friendliness. For example, a 50/50 solution by volume of tetrahydrofurfuryl alcohol and limonene has a vapor pressure of about 2 mm Hg at 20 degrees C (68 degrees F.) and a flash point (Pensky-Martens Closed Cup) of about 52.7 degrees C. (127 degrees F.). (The low vapor pressure makes accurate vapor pressure measurement difficult, therefore the pressure measurement shown is considered more qualitative than quantitative.) The present invention is environmentally-friendly, in that, limonene and tetrahydrofurfuryl alcohol are both made from naturally renewable resources and have no ozone-depletion potential and no known adverse health effects. Further, a solution of tetrahydrofurfuryl alcohol and limonene exhibits azeotropic and azeotrope-like properties over a wide range of proportions of the constituents and, thus, is easily recyclable. Finally, the composition of the present invention can be warm water rinsed effectively without surfactants. This combination of characteristics is an unanticipated result of combining these individual components and makes the current invention highly desirable as a cleaner, especially in precision cleaning operations.

1. Limonene

The monocyclic terpene, p-mentha-1,8 diene, commonly known as limonene, is a colorless solvent with a high-boiling point. Limonene has the formula:

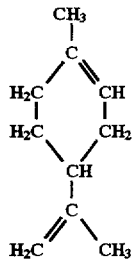

Limonene is commercially available from several sources including SCM Glidco Organics and Bush Boake Allen, both in Jacksonville, Fla. It is manufactured from renewable sources such as pine and citrus products. The flash point of limonene is moderately high (50 degrees C., 122 degrees F.) and the boiling point is high (178 degrees C., 352 degrees F.). Refining limonene by distillation can produce low-odor and high-purity versions. Generally, "commercial grade" limonene contains small amounts (around five percent or less by weight) of other terpene hydrocarbons and may contain a stabilizer such as butylated hydroxytoluene (BHT). The low-odor, high-purity terpenes have a high solvency for a wide range of non-polar contaminants such as greases and oils. Terpenes are readily metabolized by bacteria and other organisms and rapidly oxidize in the atmosphere, resulting in minimal environmental impact. They are classified as Generally Recognized as Safe (GRAS) by the United States Food and Drug Administration and are approved for human consumption in foods. Terpenes are found in food and fragrance products.

2. Tetrahydrofurfuryl Alcohol

Tetrahydrofurfuryl alcohol, a heterocyclic alcohol, is a colorless, low odor, pH neutral solvent and has the formula:

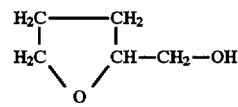

Tetrahydrofurfuryl alcohol is commercially available from several sources, including Great Lakes Chemical Corporation, Specialty Chemicals Division, in West Lafayette, Ind. and Ashland Chemical Company in Columbus, Ohio. Commercially available or "commercial grade" tetrahydrofurfuryl alcohol typically is 98 percent by weight pure with small (under two percent by weight) amounts of furfuryl alcohol and 1,5-Pentanediol along with less than one percent by weight moisture and a stabilizer. Tetrahydrofurfuryl alcohol is manufactured from annually renewable agricultural resources and is chemically and thermally stable. As with other heterocyclic alcohols, tetrahydrofurfuryl alcohol's flash point (74 degrees C.; 165 degrees F.) is higher and vapor pressure (0.2 mm Hg at 20 degrees C., 68 degrees F.) is lower than traditional (short linear chain) alcohols, such as isopropyl, methyl, and ethyl alcohol. Heterocyclic alcohols, like traditional alcohols, are miscible in water; tetrahydrofurfuryl alcohol is completely water miscible. Water miscibility enhances the ability to completely remove a cleaning agent and soils during water rinsing. Tetrahydrofurfuryl alcohol has a high boiling point (178 degrees C.; 352 degrees F.) and a high solvency for most polar contaminants including both organic and inorganic materials. It is nonphotochemically reactive (as defined in California State Regulations Rule 66) and is an EPA-approved solvent that readily biodegrades, is completely saturated, and shows low toxicity. It is only slightly irritating to the skin and mildly irritating to the eye.

Preferred Embodiment

The composition of the preferred embodiment of the present invention is comprised of effective amounts of tetrahydrofurfuryl alcohol and limonene. As used herein, "effective amounts" indicates the percentages of the various components, tetrahydrofurfuryl alcohol and limonene to satisfactorily clean the item or items to be cleaned. As a practical matter, satisfactory cleaning of most polar and non-polar contaminants is obtained over a wide range of mixtures. However, it may be appropriate in certain circumstances involving primarily polar or non-polar contaminants to increase the relative percentage of the tetrahydrofurfuryl alcohol component (for polar contaminants) or the limonene component (for non-polar contaminants). Further, for most cleaning applications, commercial grades of the components of the composition of the present invention provide satisfactory results.

The best test results for the composition of the present invention used as a cleaning agent have been obtained from a composition composed of from about 20 to about 80 percent by volume tetrahydrofurfuryl alcohol and from about 80 to about 20 percent by volume limonene and cleaning efficacy appears uniform across that range. The composition may contain a stabilizer to inhibit oxidation or polymerization to provide a longer shelf life without degradation. Depending upon the particular contaminant being removed, satisfactory results may be obtained with component fractions outside of the ranges noted.

For example, in situations in which azeotrope-like properties are less important, a range of about 10 to about 90 percent by volume tetrahydrofurfuryl alcohol and about 90 to about 10 percent by volume limonene may provide acceptable results. Further, in situations where a significant amount of recycling of the cleaning agent is anticipated, solutions closer to a true azeotropic balance may provide more acceptable results, such as from about 30 to about 50 percent by volume tetrahydrofurfuryl alcohol and from about 70 to 50 percent by volume limonene.

The composition of the present invention is formulated by mixing appropriate volumes of the two major components, tetrahydrofurfuryl alcohol and limonene, together. If stabilizers are not in the individual components, an appropriate stabilizer may be added to the solution to improve shelf life if required. As noted in the examples below, the stabilizers typically are removed upon distillation of the solution and, thus, must be re-added to the distillate if required.

In use, the substrate to be cleaned is exposed to the cleaning agent. The method of exposure is dictated by the type of substrate and type of contaminant to be removed and includes basically any standard cleaning technique including, but not limited to, immersion of the substrate in the cleaning agent, immersion accompanied by agitation, and spraying the cleaning agent onto the substrate.

The absence of surfactants, along with the use of high purity constituents, essentially eliminates the amount of nonvolatile residue from the cleaning operation. In many cases, satisfactory cleanliness can be achieved without a final rinse. However, for precision cleaning applications, it is recommended that a final rinse be performed. The preferred rinse is to use high purity deionized water (>10M Ω-cm), heated to at least 40 degrees C. (104 degrees F.). Further, high purity forms of limonene and tetrahydrofurfuryl alcohol are desirable for use in contaminant-sensitive operations. The composition of the present invention is formulated to be warm water rinsable without the use of surfactants. When exposure to water is undesirable, the composition of the present invention can also be effectively rinsed using an alcohol such as isopropyl or other traditional alcohols.

As discussed below, the precise azeotropic composition appears to be within the range of about 37 to about 39 percent by volume tetrahydrofurfuryl alcohol and from about 63 to about 61 percent by volume limonene at atmospheric pressure. Regardless of where the true azeotrope lies, all compositions from about 20 to about 80 percent by volume tetrahydrofurfuryl alcohol and from about 80 to about 20 percent by volume limonene are azeotrope-like at atmospheric pressure (760 millimeters mercury), as defined more particularly below.

The term "azeotrope-like" as used herein is intended to mean that the composition behaves like an azeotrope, i.e., has constant-boiling characteristics or a tendency not to fractionate upon boiling or evaporation. Thus, in such compositions, the composition of the vapor formed during boiling or evaporation is identical or substantially identical to the original liquid composition. Hence, during boiling or evaporation, the liquid composition, if it changes at all, changes only to a minimal or negligible extent. This is contrasted with non-azeotrope-like compositions in which the liquid composition changes substantially during boiling or evaporation. As is readily understood by persons skilled in the art, the boiling point of the azeotrope-like composition will vary with the pressure.

It should be noted that the azeotrope-like compositions of the present invention may include additional components which do not form new azeotropic or azeotrope-like systems. For example, as noted above, the composition of the present invention may contain stabilizers. Typically, however, the stabilizers will be eliminated from the composition in a first distillation cut taken as described below.

One way to determine whether the addition of a component forms a new azeotropic or azeotrope-like system is to distill a sample thereof under conditions which would be expected to separate the mixture into its separate components. If the mixture containing the additional component is non-azeotropic or non-azeotrope-like, the additional component will fractionate, i.e., separate from the azeotropic or azeotrope-like components. If the mixture is azeotrope-like, some finite amount of a first distillation cut will be obtained which contains all of the mixture components and which is constant-boiling or behaves as a single substance. As used here, the term "first distillation cut" means the first cut taken after the distillation column displays steady state operation under total reflux conditions.

Because the composition of the present invention is azeotrope-like over a wide range of from about 20 to about 80 percent by volume tetrahydrofurfuryl alcohol and from about 80 to about 20 percent limonene, it may be recycled by distillation to remove contaminants in that range or other ranges in which it exhibits azeotrope-like properties.

The invention is further illustrated by the following non-limiting examples:

EXAMPLE 1 & COMPARATIVES

A generally accepted cleanliness test method used in military electronics soldering specifications is an ionic cleanliness test, designated as MIL-P-28809, "Military Specification for Circuit Card Assemblies Rigid, Flexible, and Rigid-Flex." This test measures the change in resistivity of an isopropyl alcohol and water rinse solution due to ionic contamination dissolved and removed from the test sample. In order to verify the effectiveness of the cleaning agent, initial cleanliness testing was performed using a Kenco Industies, Inc. of Atlanta Georgia Omega Meter Model 600.

Test samples were prepared by depositing a measured amount of rosin-activated flux on printed wiring assemblies and drag soldering the samples in a 254-degree C. (490-degree F) solder pot for approximately seven seconds. The test samples were then cleaned using a solution of 50 percent by volume tetrahydrofurfuryl alcohol and 50 percent by volume limonene in a 40 kHz ultrasonic cleaning tank for one minute after which the samples were blown dry with dry nitrogen. For comparison, other test samples were cleaned using the above-described procedure with tetrahydrofurfuryl alcohol alone and other test samples were cleaned with limonene alone.

Laboratory ionic cleanliness testing was conducted on the test samples cleaned. Ionic testing results of the cleaned samples is shown in table 1, below.

TABLE 1

| Ionic Cleanliness, MIL-P-28809 | |
|---|---|
| Cleaning agent (Percentages are by volume) | Ionic Cleanliness, Average Value (Micrograms NaCl equivalent/Sq. Inch) |
| 100 percent limonene | 9.3 |
| 100 percent tetrahydrofurfuryl alcohol | 6.6 |
| 50 percent limonene and 50 percent tetrahydrofurfuryl alcohol | 2.4 |

This laboratory testing indicates unexpected synergistic effects of combining limonene with tetrahydrofurfuryl alcohol which result in a significant improvement in cleaning efficacy over either used alone.

The theory for the effectiveness of this cleaning agent for electrical applications is that the nonpolar limonene component effectively removes the organic content of the rosin flux contaminant enabling the ionic contaminants to be removed by the polar component, tetrahydrofurfuryl alcohol.

EXAMPLE 2 & COMPARATIVES

More extensive ionic cleanliness testing was performed on sample printed wiring assemblies (PWAs). The PWA test samples were prepared by wave soldering using a mildly activated rosin flux. The samples were then cleaned in the cleaning agents shown in table 2 using a batch-type spray cleaner for four minutes. Two of the three sample groups were then spray rinsed for four minutes in 60-degree C. (140-degree F.) deionized water (>1M Ω-cm resistivity) using a batch aqueous cleaner. One set of the limonene samples also received an isopropyl alcohol (IPA) spray rinse for one minute and 30 seconds prior to water rinsing. The samples were then tested in an Alpha Metals, Inc. of Alpharetta, Ga. Omegameter OM700 using a 15-minute automatic termination test and an extract solution temperature of 41 degrees C. (106 degrees F.). Table 2, below shows the test data from the ionic cleanliness testing.

TABLE 2

Ionic Testing Data

| Cleaning agent | Rinse | Ionic Cleanliness, Average Value (Micrograms NaCl equivalent/Sq. Inch) |
|---|---|---|
| limonene | IPA | 9.5 |
| limonene | IPA spray followed by Water | 6.5 |
| 50 percent volume tetrahydrofurfuryl alcohol & 50 percent limonene | Water | 2.3 |

This laboratory testing confirms the unexpected synergistic effects of combining limonene with tetrahydrofurfuryl alcohol which result in a significant improvement in cleaning efficacy over limonene used alone.

EXAMPLE 3

Additional testing was performed to assess organic cleaning efficacy of the present invention. Test samples were prepared in the same manner as described in the previous ionic cleanliness testing study, example 2 above.

A method for measuring organic contamination is the residual rosin test, as described in the Institute for Interconnection and Packaging Electronic Circuits (IPC) document as IPC-TR-580 "Cleaning and Cleanliness Test Program Phase 1 Test Results." This test is performed by measuring the change in absorbency of a test sample extract solution by using an ultraviolet/visible spectrophotometer. The change in absorbency can then be correlate to micrograms of residual rosin per sq. inch of test sample surface area. In this case, an extract solution of 99% IPA and 1% phosphoric acid was used. Each test sample was exposed to an agitated extract solution for one hour prior to solution measurement. Results of the residual rosin testing are shown in table 3, below.

TABLE 3

Residual Rosin Testing

| Cleaning agent | Rinse | Residual Rosin (Micrograms Rosin/ Sq. inch) |
|---|---|---|
| limonene | IPA | 148 |
| limonene | IPA spray followed by Water | 161 |
| 50 percent tetrahydrofurfuryl alcohol & 50 percent limonene | Water | 90 |

Data from the ionic and residual rosin testing demonstrate that the present invention is effective as a cleaning agent to remove both the polar and nonpolar contaminants from rosin flux soldering processes.

EXAMPLE 4

Laboratory analysis was performed on Kovar test samples with gold over nickel plating, some contaminated with Apeizon M vacuum grease, others contaminated with Kester 135 rosin flux baked on at 350 degrees C. (688 degrees F.) for three minutes. The test samples were then ultrasonically cleaned at 40 kHz for three minutes with the 1:1 by volume tetrahydrofurfuryl alcohol and limonene cleaning agent and then rinsed with IPA for one minute. Additional samples were prepared and cleaned as described above with the exception that deionized water was utilized as a rinse in lieu of IPA. Gas Chromatography Mass Spectroscopy (GC/MS) was performed on the test samples using a Finnigan-MAT-TSQ-70. Additional testing of similarly prepared samples was done using Fourier Transform Infrared Spectroscopy (FTIR) on a Nicolet model 710 with microscope attachment. Results from both GC/MS and FTIR showed that the Apeizon M grease and Kester 135 flux were removed using the cleaning agent and rinses leaving no detectable levels of contamination on the test samples.

EXAMPLE 5

In order to verify the azeotrope-like nature of the composition of the present invention, various solutions of tetrahydrofurfuryl alcohol and limonene as shown in table 4 were distilled in a Kontes distillation column operated at atmospheric pressure. Comparative analysis of the resulting distillate to the original solutions was performed on a gas chromatograph using a flame ionization detector. The analysis, summarized in table 4, below, indicates that azeotrope-like behavior appears to exist over a wide range from about 20 to 80 volume percent tetrahydrofurfuryl alcohol with the balance limonene. One notable result of this testing is that the stabilizers present in the limonene and tetrahydrofurfuryl alcohol were removed in the distillation operation.

TABLE 4

Azeotropicity Testing

| Solution tested, | Results | |
|---|---|---|
| Tetrahydrofurfuryl Alcohol/Limonene, percent volume | Shift in Concentration Noted | Liquid Boiling Temperature degrees C. |
| 100/0 | N/A | 178 |
| 90/10 | Yes | 172 |
| 80/20 | slight | 168 |
| 70/30 | slight | 167 |
| 60/40 | slight | 167 |
| 50/50 | minimal | 167 |
| 40/60 | minimal | 167 |
| 37/63 to 39/61 | no detectable shift | 166 |
| 30/70 | minimal | 166 |
| 20/80 | slight | 167 |
| 10/90 | yes | 168 |
| 0/100 | N/A | 178 |

Based upon this testing, it appears that the solution is azeotropic in the range of about 37 to 39 percent by volume tetrahydrofurfuryl alcohol with the balance limonene. Further, the solution is azeotrope-like in a broad band from about 20 to about 80 percent by volume tetrahydrofurfuryl alcohol with the balance limonene.

EXAMPLE 6

In order to verify the ability to utilize the azeotropic characteristics to distillation-clean the used cleaning agent, solutions of 50 percent by volume tetrahydrofurfuryl alcohol and 50 percent by volume limonene, with a variety of typical contaminants were distilled in a Kontes distillation column operated at reduced pressure (560 mm Hg). Comparative analysis of the resulting distillate to a standard uncontaminated solution was performed on a GC/MS. The analysis, summarized in table 5, below, indicates that the contaminants were effectively removed from the cleaning agent. This indicates that the limonene and tetrahydrofurfuryl cleaning agent may be recycled for continued use, further demonstrating its usefulness and environmental friendliness.

TABLE 5

Recyclability Testing

| Contaminant tested | Results |
|---|---|
| No contaminant added. GC/MS testing showed .12 percent by weight non-volatile matter in solution made with commercial ingredients | .02 percent non-volatile matter in distillate (distilled once) |
| .33 percent by weight Azepion M vacuum grease | .02 percent by weight contaminant in distillate (distilled once) |

What is claimed is:

1. A composition comprised of effective amounts of tetrahydrofurfuryl alcohol and limonene to satisfactorily clean the item or items to be cleaned, and wherein no surfactant is present.

2. A composition as claimed in claim 1 wherein said tetrahydrofurfuryl alcohol and said limonene are commercial grade; wherein commercial grade limonene contains about five percent or less by weight of other terpene hydrocarbons and may contain a stabilizer such as butylated hydroxytoluene and wherein commercial grade tetrahydrofurfuryl alcohol is about 98 percent by weight pure with small (under about two percent by weight) amounts of furfuryl alcohol and 1,5-Pentanediol along with less than about one percent by weight moisture and a stabilizer.

3. A composition consisting essentially of effective amounts of tetrahydrofurfuryl alcohol and limonene to satisfactorily clean the item or items to be cleaned, and wherein no surfactant is present.

4. A composition as claimed in claim 3 wherein said tetrahydrofurfuryl alcohol and said limonene are commercial grade; wherein commercial grade limonene contains about five percent or less by weight of other terpene hydrocarbons and may contain a stabilizer such as butylated hydroxytoluene and wherein commercial grade tetrahydrofurfuryl alcohol is about 98 percent by weight pure with small (under about two percent by weight) amounts of furfuryl alcohol and 1, 5-Pentanediol along with less than about one percent by weight moisture and a stabilizer.

5. A composition, comprising from about 10 to about 90 percent by volume tetrahydrofurfuryl alcohol and from about 90 to about 10 percent by volume of limonene, and wherein no surfactant is present.

6. A method of formulating a composition consisting essentially of the step of mixing from about 10 to about 90 percent by volume tetrahydrofurfuryl alcohol with from about 90 to about 10 percent by volume of limonene, and wherein no surfactant is present.

7. A composition as claimed in claim 5, wherein the concentration percent by volume of said tetrahydrofurfuryl alcohol is from about 30 to about 50 and the concentration percent by volume of said limonene is from about 70 to about 50, and wherein no surfactant is present.

8. A method of formulating a composition as claimed in claim 6 wherein the percent by volume of said tetrahydrofurfuryl alcohol is from about 20 to about 80 and the percent by volume of said limonene is from about 80 to 20.

9. An azeotrope-like composition, consisting essentially of from about 20 to about 80 percent by volume tetrahydrofurfuryl alcohol and from about 80 to about 20 percent by volume limonene which composition boils at about 166 degrees centigrade at a pressure of about 760 millimeters mercury, and wherein no surfactant is present.

10. An azeotrope-like composition as claimed in claim 9 wherein the concentration percent by volume of said tetrahydrofurfuryl alcohol is from about 30 to about 50 and the concentration percent by volume of said limonene is from about 70 to about 50.

11. An azeotrope-like composition as claimed in claim 9 wherein the concentration percent by volume of said tetrahydrofurfuryl alcohol is from about 37 to about 39 and the concentration percent by volume of said limonene is from about 63 to about 61.

12. A method of formulating a composition comprising the step of mixing from about 10 to about 90 percent by volume tetrahydrofurfuryl alcohol with from about 90 to about 10 percent by volume of limonene, and wherein no surfactant is added.

13. A method of formulating a composition as claimed in claim 12 wherein the percent by volume of said tetrahydrofurfuryl alcohol is from about 20 to about 80 and the percent by volume of said limonene is from about 80 to 20.

14. A method of formulating a composition as claimed in claim 12 wherein the percent by volume of said tetrahydrofurfuryl alcohol is from about 30 to about 50 and the percent by volume of said limonene is from about 70 to 50.

15. A method of formulating a composition as claimed in claim 12 wherein the percent by volume of said tetrahydrofurfuryl alcohol is from about 37 to about 39 and the concentration percent by volume of said limonene is from about 63 to about 61.

16. A method of formulating a composition as claimed in claim 6 wherein the percent by volume of said tetrahydrofurfuryl alcohol is from about 30 to about 50 and the percent by volume of said limonene is from about 70 to 50.

17. A method of formulating a composition as claimed in claim 6 wherein the percent by volume of said tetrahydrofurfuryl alcohol is from about 37 to about 39 and the concentration percent by volume of said limonene is from about 63 to about 61.

* * * * *